United States Patent [19]

Wacker et al.

[11] Patent Number: 4,770,921

[45] Date of Patent: Sep. 13, 1988

[54] SELF-SHIELDING MULTI-LAYER CIRCUIT BOARDS

[75] Inventors: Thomas P. Wacker; Charles W. Eichelberger, both of Schenectady; Robert J. Wojnarowski, Ballston Lake, all of N.Y.

[73] Assignee: Insulating Materials Incorporated, Schenectady, N.Y.

[21] Appl. No.: 906,108

[22] Filed: Sep. 11, 1986

[51] Int. Cl.$^4$ .................. B32B 3/00; B32B 9/04; B22F 3/00; H05K 1/00

[52] U.S. Cl. .................. 428/209; 428/447; 428/546; 428/549; 428/551; 428/901; 174/68.5; 361/398; 361/402

[58] Field of Search .............. 428/209, 546, 901, 549, 428/210, 447, 551; 427/96; 174/68.5; 156/297; 361/398, 402

[56] References Cited

U.S. PATENT DOCUMENTS

| | | | |
|---|---|---|---|
| 4,404,237 | 9/1983 | Eichelberger et al. | 427/96 |
| 4,416,914 | 11/1983 | Eichelberger et al. | 427/54.1 |
| 4,438,291 | 3/1984 | Eichelberger et al. | 136/236 R |
| 4,470,883 | 9/1984 | Eichelberger et al. | 204/15 |
| 4,487,811 | 12/1984 | Eichelberger et al. | 428/546 |
| 4,495,251 | 1/1985 | Eichelberger et al. | 428/548 |
| 4,522,888 | 6/1985 | Eichelberger et al. | 428/546 |
| 4,528,748 | 7/1985 | Eichelberger et al. | 29/835 |
| 4,591,220 | 5/1986 | Impey | 339/17 M |

*Primary Examiner*—John E. Kittle
*Assistant Examiner*—Patrick J. Ryan
*Attorney, Agent, or Firm*—Heslin & Rothenberg

[57] ABSTRACT

Self-shielding multi-layer circuit boards are produced utilizing augmentative replacement techniques.

12 Claims, No Drawings

SELF-SHIELDING MULTI-LAYER CIRCUIT BOARDS

The present invention relates to self-shielding multi-layer circuit boards. More particularly, the present invention relates to self-shielding multi-layer circuit boards which emit reduced levels of static electromagnetic radiation or "noise".

BACKGROUND OF THE INVENTION

In recent years, the use of compact circuitry has made possible the downsizing of electronic hardware and its subsequent proliferation into a great number of new locations and uses. However, both the downsizing of hardware and its proliferation into many new locations has exacerbated the already existing problem of static electromagnetic radiation or noise emission. Noise emission by circuits within an item of hardware can interfere with other electronic devices within the same item of hardware or can interfere with electronic devices within other proximate items of hardware. The smaller the item of hardware, the more severe the problem with internal interference and the more difficult it is to solve such internal interference by conventional techniques. Similarly, where an item of hardware is used in a great number of differing locations, the chances that it will interfere with or conversely be interfered with by a second item of hardware are greatly increased.

Methods of shielding circuitry from interference and preventing noise emission are well known. Most such methods require that a conductive shield encase the circuitry which is to be protected or which is the source of noise. These conductive shields may be made from metal or from a conductive plastic such as a conductive fiber filled plastic. Shielding by these methods, however, will prevent maximum equipment downsizing due to the bulk of the shielding material, or will prevent internal shielding because only a single shielding layer is placed about the entire item of hardware.

Therefore, it is an object of the present invention to produce multi-layer circuit boards which emit reduced levels of noise and which are less susceptible to interference from other noise sources.

It is another object of the present invention to produce multi-layer circuit boards which are self-shielding.

It is yet another object of the present invention to produce a board where adjacent conductor runs of a conductive patter do not couple.

DETAILED DESCRIPTION OF THE INVENTION

Briefly, according to the present invention, there is produced a self-shielding multi-layer circuit board comprising:

(a) a two-sided base, (b) at least one combination of circuit conductive pattern with insulating dielectric layer adhered thereto designed on at least one side of said base, and (c) uniform voltage conductive patterns designed as an outermost conductive pattern on both sides of said two-sided base, wherein said uniform voltage conductive pattern covers a sufficient surface area of all underlying circuit conductive patterns to provide a shielding effect and at least one of said uniform voltage conductive patterns is designed by augmentative replacement techniques.

The circuit conductive pattern or uniform voltage conductive pattern applied directly to the surface of the two-sided base for use herein may be designed by conventional printed circuit techniques. For example, where the two-sided base is a glass epoxy blank or the like, laminated with conductive foil, the conductive pattern may be imaged in the foil by conventional resist imaging techniques. Alternatively, where it is not desirable to provide a conductive pattern directly to the surface of the two-sided base by resist imaging the desired conductive pattern may be provided by means of an augmentative replacement reaction. The augmentative replacement reaction adds to and replaces the metal contained in a cured polymer to form the conductive pattern as described in U.S. Pat. Nos. 4,404,237 and 4,470,883, issued to Eichelberger, et al., and hereby incorporated by reference. Further conventional techniques include, without limitation, pad flexographic printing, stencil, rotogravure, and offset printing.

For circuit conductive patterns or uniform voltage conductive patterns other than applied directly to the two-sided base, it is at present understood that such may only be applied by augmentative replacement. Thus, where a circuit conductive pattern is designed on one side of a two-sided base by an conventional technique and insulated or covered with a dielectric layer, augmentative replacement must be utilized to add a second conductive pattern on that same side to the surface of the dielectric layer. Other conventional techniques simply cannot be used to provide this multi-layer stacked configuration or are inconvenient for doing so.

The two-sided base on which the conductive patterns are formed is not restricted and is generally any insulator to which metal ink or conductive foil can be adhered. Thus, the usual printed circuit bases can be used including glass filled polyesters, glass filled epoxy, phenolic boards, polystyrene, glass covered with porcelain, and the like. The two-sided base for use herein has a small thickness in comparison to length and width and is thus simply a "board". The board is intended to support the conductive pattern as well as the associated electronic devices which form a circuit. For use herein, the board should have a thickness no greater than about ¼ inch and preferably less.

Metal containing polymers, or metal inks, used in augmentative replacement are a combination of a finely divided metallic powder composition with a polymer whose viscosity and flow characteristics are controlled by the incorporation of a solvent therein. The metal can be any metal which is stable in the ink and cured polymer and which can be obtained in finely divided form and which is placed above the metal used in the augmentative replacement reaction in the activity series of the metals. Because of its availability and low cost, the preferred metal is iron. The metal powder generally has a particle size of less than about 50 microns, preferably 3 to about 25 microns and most preferably about 15-25 microns. When the ink is deposited by screen printing, the metal particles must be of a size to pass through the screen.

The polymers employed in the ink are any curable material or mixture thereof which exhibits a degree of adhesion to the substrate being employed and to the finely divided metal powder which is dispersed therein. Typical polymers which can be employed include the homopolymers and copolymers of ethylenically unsaturated aliphatic, alicyclic and aromatic hydrocarbons such as polyethylene, polypropylene, polybutene, ethylene propylene copolymers, copolymers of ethylene or propylene with other olefins, polybutadiene, polyisoprene, polystyrene and polymers of pentene, hexene, heptene bicyclo(2,2,1)2-heptane, methyl styrene and the like. Other polymers which can be used include polyindene, polymers of acrylate esters and polymers of acrylate esters and polymers of methacrylate esters, acrylate and methacrylate resins such as ethyl acrylate, n-butyl methacrylate, isobutyl methacrylate, ethyl methacrylate and methyl methacrylate; alkyd resins; cellulose derivatives such as cellulose acetate, cellulose acetate butyrate, cellulose nitrate, ethyl cellulose, hydroxyethyl cellulose, methyl cellulose, and sodium carboxymethyl cellulose; epoxy resins; hydrocarbon resins from petroleum; isobutylene resins; isocyanate resins (polyurethanes); melamine resins such as melamine-formaldehyde and melamine-urea-formaldehyde; oleo-resins, polyamide polymers such as polyamides and polyamide-epoxy polyesters; polyester resins such as the unsaturated polyesters of dibasic acids and dihydroxy compounds; polyester elastomer and resorcinol resins such as resorcinol-formaldehyde, resorcinol-furfural, resorcinol-phenol-formaldehyde, and resorcinol-urea; rubbers such as natural rubber, reclaimed rubber, chlorinated rubber, butadiene styrene rubber, and butyl rubber, neoprene rubber, polysulfide, vinyl acetate and vinyl alcohol-acetate copolymers, polyvinyl alcohol, polyvinyl chloride, polyvinyl pyrrolidone and polyvinylidene chloride, polycarbonates, graft copolymers of polymers of unsaturated hydrocarbons and of unsaturated monomers such as graft copolymers of polybutadiene, styrene and acrylonitrile, commonly called ABS resins, polyamides and the like, including those additional examples detailed in the aforementioned Eichelberger, et al., patents.

The polymers and inks of the present invention can contain various other materials such as fillers, e.g., glass fiber, glass powder, glass beads, asbestos, mineral fillers, wood flower and other vegetable fillers, dyes, pigments, waxes, stabilizers, lubricants, curing catalysts such peroxides, photosensitizers and amines, polymerization inhibitors adhesion promoters, wetting agents and the like. It is preferred, but not essential, to employ a polymer which exhibits a substantial degree of volumetric shrinkage upon curing.

The amounts of the finely divided metal and polymer are adjusted such that the metal constitutes about 60–80% by volume of the mixture after curing. Preferably, the metal is about 70% by volume. It is desired to have the surface of the cured ink contain a significant amount of the metal particles to facilitate the subsequent augmentative replacement reaction.

A solvent is used in the ink formulation in order to adjust the viscosity and flow characteristics for the type of printing desired. In general, the solvent should be employed in an amount sufficient that the ink has a viscosity of 15,000–200,000 cps at room temperature and preferably about 50,000–150,000 cps. Suitable solvents or diluents can be aliphatic or aromatic and usually contain up to about 30 carbon atoms. They include the hydrocarbons, ethers and thioethers, carbonyl compounds such as esters and ketones, nitrogen containing compounds such as amides, amines, nitriles and nitro compounds, alcohols, phenols, mercaptans and halogen containing compounds. Examples include alcohols such as methanol, ethanol, propanol, benzyl alcohol, cyclohexanol, ethylene glycol, glycerol and the like, aromatic materials such as benzene, toluene, xylene, ethyl benzene, naphthalene, tetralin and the like, ethers such as methyl ether, ethyl ether, propyl ether, methyl t-butyl ether, and the like, alkanes such as methane, ethane, propane and the like, dimethyl sulfoxide, butyl formate, methyl acetate, ethyl acetate, formamide, dimethyl formamide, acetamide, acetone, nitrobenzene, monochlorobenzene, acetophoenone, tetrahydrofuran, chloroform, carbon tetrachloride, trichloroethylene, ethylbromide, phenol, mercaptophenol, and the like. Additionally, reactive solvents or diluents such as triallyl isocyanurate can be used if desired. It is preferred to employ a solvent which is relatively non-volatile at room temperature so that the viscosity and flow of the ink is appropriate during application to the substrate and highly volatile at the curing temperature of the polymer or at other temperatures above the application temperature. The carbitol series of solvents and particularly butyl carbitol (diethylene glycol monobutyl ether) has been found to be particularly appropriate.

The ink is applied to the substrate to achieve the desired conductor patterns thereon. For example, standard printed circuit application technology can be employed. Any temperature which will not cause premature curing of the ink and at which the viscosity and flow characteristics of the ink are appropriate to the application technique used can be employed. It is preferred, but not necessary, to permit at least a portion of the solvent to evaporate after application of the ink to the substrate and before curing. The act of evaporation exposes addition metal powder and increases the ratio of metal powder to polymer so as to achieve a balance between sufficient metal to provide a base for the conductive film to be formed thereon and too little polymer to act as a binder to hold the metal particles. Preferably, the drying is effected for 0.1–1 hour, more preferably, about 0.25–0.5 hour, at a temperature of about 70°–150° C., most preferably about 110°–130° C.

The ink polymer is cured or polymerized by the most convenient method. If an autocatalyst has been added, the polymer will cure by itself with no additional initiation. In the case of ultraviolet light initiators, the substrates carrying the conductor patterns can be passed under a high intensity ultraviolet source which causes the initiators to begin the curing reaction. It is presently preferred to employ a thermal curing system which is activated by exposure to temperatures of about 140°–200° C., preferably about 150°–180° C., for a time of 0.1–1 hour, preferably, 0.15–0.5 hour. As a result of this step, a closely compacted metal powder bound to the substrate by the cured polymer is achieved. Because of the high percentage of metal and shrinkage of the polymer chosen, the conductive pattern thus obtained may have some conductivity due to physical contact between the metal particles. In the preferred embodiment of this invention that conductivity is on the order of about 30 Kohm per square for a one mil thick deposit. The resistance will be highly variable and increase substantially if the system is subjected to oxidizing conditions for any period of time since an oxide builds up between particles and reduces conductivity.

In some instances, it may be desirable to only partially cure the polymer. For example, occasions arise where it is desirable to mount components by inserting the leads thereof in the polymer ink. In such instances, it may be desirable to partially cure the polymer or only gel the polymer in situations where the polymer employed is gelable, so as to provide an adhesive for the lead wire.

The ink-designed substrate is subjected to an augmentation replacement reaction in which some of the metal of the powder is replaced by a metal further down in the activity series, i.e., which is more noble. This step takes advantage of the known chemical behavior of metals, i.e. that any metal will displace any succeeding, less active, metal from a water solution of one of its salts. However, in this invention, it has been found that while the powder metal enters into solution from the surface and somewhat below the surface of the polymer, the plating out of the more-noble metal takes place to a large extent on the surface. Thus, an additional amount of more-noble metal is deposited on the surface than that which would form a one-to-one exchange with the powder metal at the surface. The additional metal from the solution plates to the original and replacement metal particles which are adhered to the substrate by the polymer to interconnect all metal particles at the surface and thus form a contiguous film of conductive metal over the printed conductor pattern. It has been found that several hundred microinches of conductor material can be built up from a solution in a period of 5 minutes.

The augmentative reaction reagent is a solution, preferably inorganic and most preferably aqueous, of a metal salt. The cation of the metal salt is any more noble or electropositive metal than the metal of the finely divided powder, i.e., lies below the powder metal in the activity series, and which is electrically conductive. Any anion can be used which is relatively inert, i.e., does not deleteriously affect the process and which forms soluble salts with both the cation metal and the powder metal. Typical salts include copper nitrate, copper acetate, copper fluoroborate, potassium gold cyanide, nickel sulfate, nickel chloride, nickel sulfamate, potassium silver cyanide, silver chloride and the like. The presently preferred metal salt is copper sulfate. The concentration of the metal salt in the solution can range from 0.1 molar to saturation but is preferably about 0.5–2.0 molar. Below about 0.5 molar, deposition rates are inordinately slow and there is no improvement in rate at molarities about 2.0. Most preferably, the metal salt is present at a concentration of about 1 molar.

When copper sulfate is used as the augmentative metal, a copper layer is formed with a new unoxidized copper which can be readily soldered. If further enhancement is desired or if soldering of the circuits is to be delayed for a substantial period of time, the conductor pattern formed can be dipped in a tin plating solution so that the tin will replace some of the copper. Tin and copper are very close in the activity series and the normal replacement reaction would cause copper to be plated out on the tin. However, by adding appropriate complexing ions, the tin will replace the copper. The tin plated copper thus formed is very readily soldered and can be left for periods of a month or more and good soldering can still be achieved. Suitable tin plating solutions are commercially available for plating on copper such as, for example, Coppertech Electroless tin Plating Solution ST-210 or ST-240. The augmentation reaction can be carried out at any suitable temperature although elevated temperatures are generally preferred in order to increase reaction rate. Thus, any temperature from ambient up to about 100° C. can be employed although the temperature is preferably about 45°–60° C. Generally the augmentation reaction is completed in about 2 minutes to 20 minutes or more, preferably about 5 minutes.

The first step to manufacture a circuit board as claimed in the present invention is to design a circuit conductive pattern by conventional techniques on at least one side of a two-sided base. A pattern may of course be designed on both sides of the base and connected by through holes. Subsequently a dielectric material is applied to insulate the first circuit conductive pattern from subsequently applied conductive patterns. The thickness of the dielectric layer should be sufficient to prevent significant current flow between overlapping conductors, and to prevent dielectric breakdown and the like. Generally, the thickness of a dielectric layer ranges from about 1 to about 4 mils. Successive circuit conductive patterns alternated with insulating dielectric layers may be designed and applied to the surface of the first circuit conductive pattern on one or both sides of the base. As above, while the first conductive pattern may be designed by any conventional technique, augmentative replacement is preferred to design additional conductive patterns.

The dielectric layer may be applied over the entire surface of both the substrate and conductive pattern. In this case, however, excessive dielectric material is wasted. Thus, it may be desirable to apply and cure the dielectric material to only those areas where its insulative effect is needed. This may be done roughly with a simple stencil or screen printing in the case of a liquid dielectric material or by forming a dry film dielectric material to shape. Greater accuracy of dielectric layer placement may be achieved by photo-imaging the dielectric layer as disclosed in docket number 60SI-1078 filed on the same day herewith. It should be kept in mind, that the dielectric layer may be applied in substantially the pattern of the conductive pattern to which it is applied or it may be applied substantially in the pattern of a further conductive pattern which is to be applied. In the first instance, undesirable contacts are avoided between the first conductive pattern and all conductive patterns applied thereafter, and in the second instance undesirable contacts are avoided between the second conductive pattern and all conductive patterns applied therebefore.

Any dielectric material which has previously been employed and either liquid or dry film is suitable for use in the present invention. For example, any of the curable polymers used as a bonder for the powder metal described above can be employed if they are sufficiently non-conductive in their cured state or can be rendered non-conductive with suitable fillers.

Dielectric materials are generally photocured and ultra-violet light initiators necessary to render the polymeric material photocurable. Aromatic onium salts of Group VIa elements may be used to render vinyl monomers, vinyl prepolymers, cyclic ethers, cyclic esters, cyclic sulfides and organosilicon cyclics photocurable. These aromatic onium salt photoinitiators are described in U.S. Pat. No. 4,058,400, hereby incorporated by reference. Onium salts of Group VIa elements may be used as photoinitiators for alkoxylated melamine resins, urea-formaldehyde resins, or phenolformaldehyde resins. These onium salt photoinitiators are described in U.S. Pat. No. 4,102,687, hereby incorporated by reference. Aromatic onium salts of Group VIa elements may be employed to render epoxy resins photocurable. These salts, include for example, triphenyl sulfonium tetrafluoroborate, triphenyl sulfonium hexafluoroantimonate, etc. and may be used to cure epoxy resins such as resins which result from the reaction of bisphenol-A and epichlorohydrin, the reaction of low molecular weight phenol-formaldehyde resins (Novolak resins) with epichlorohydrin, etc. These salts and epoxy resins which are cured thereby are disclosed in U.S. Pat. No. 4,138,255, hereby incorporated by reference. Other suitable photoinitiators and resins are well known to persons skilled in the art, for example, the peroxide cure of vinyl polymers. The present invention should not be limited to a particular photoinitiator or a particular dielectric polymeric material.

Following the design of the circuit conductive patterns and the application of dielectric layers to insulate these conductive patterns, there is designed a uniform voltage conductive pattern as the outermost conductive pattern on both sides of the two-sided base. The uniform voltage conductive pattern must cover the surface area of the underlying circuit conductive patterns to provide a shielding effect. The degree of the shielding effect is a function of the amount of surface area covered. To be effective it is desirable to cover at least about 50% of the surface area of all the underlying circuit conductive patterns as viewed from either side of the two-sided base. Preferably, it is desirable to cover a sufficient surface area of said underlying circuit traces to reduce the power of noise emission by said underlying circuit patterns by ½ in either direction from the surface of said two-sided base. Of course, where the uniform voltage conductive pattern is applied directly to the base, it may be applied by any conventional technique. However, where the uniform voltage conductive pattern is applied to a dielectric layer over a circuit conductive pattern, it should be applied by the augmentative replacement technique. Thus since there is present at least one circuit conductive pattern on any base, at least one uniform voltage conductive pattern should be designed by augmentative replacement techniques as the outermost conductive pattern. The uniform voltage conductive pattern may be designed, for example, in the form of a solid pattern having gaps only for through holes and component leads, it may be designed in the form of the underlying circuit conductive pattern, or it may be applied as a cross bar with regular spacing.

As a further benefit of the present invention, the proximity of the uniform voltage conductive pattern to the circuit conductive pattern allows for a greater decoupling effect. It is well known that substantial reduction in coupling between adjacent conductors in a conductive pattern is achieved when the "shield layer", i.e. the uniform conductive pattern, is closer to the conductors of the circuit conductive layer than the conductors are to one another. In the multi-layer circuit board of the present invention, typical dielectric layer thickness is about 1 mil while typical conductor spacing is about 10 mil.

The uniform voltage conductive pattern may be used as a power plane, a ground plane, or the like, so long as the voltage is substantially constant as a function of time across the surface of the plane. Thus, the voltage of the plane should not oscillate or change as a function of time at frequency which might create "noise" in the electromagnetic spectrum where other sensitive components may be effected. Of course, it may be desirable to split the plane into two or more insulated areas, each of which is at various but constant voltages to supply power or ground for diverse purposes. It may also be desirable to simply design the uniform voltage conductive pattern as an external shield without electrical connection to the circuit board.

By the present invention, using augmentative replacement, a circuit board may be rendered self-shielding without increased space requirements and without the use of shielding structures. While such circuit boards are not noise free due to the fact that component parts are exposed, their reduced noise levels will render them valuable for many situations.

In order to further illustrate the present invention, various non limiting examples are set forth below. Throughout the specification and claims all parts and percentages are by weight and all temperatures are in degrees celsius, unless otherwise indicated.

EXAMPLES

Example 1

Over a commercially made ¼ inch two-sided plated through board produced by standard print and etch techniques, a layer of GE product 111-304 (UV-cure, epoxy screen printable dielectric) was screen printed and cured on each side. There were holes left in this layer for both connections to the lower conductor layer and for component soldering. Over this was screen printed GE produce 111-299, a metal filled epoxy ink for augmentative replacement (described in U.S. Pat. No. 4,404,237) in the pattern of a ground plane on one side and a power plane on the other. The patterns were designed so they covered the holes in the dielectric where connection to the lower layer of conductors was desired and avoided the holes strictly for component soldering. The sample was cured and then immersed in an acidic copper sulfate bath where the exposed metal in the 111-299 ink was subjected to an augmentative replacement reaction with the subsequent plating of copper from the bath onto the ink, increasing and stabilizing its conductivity.

Example 2

Starting with the two-sided plated through hole board of Example 1, the process was repeated with different materials. The dielectric layer was prepared in the following manner. A liquid was prepared by mixing 37 grams of a solid higher molecular weight homolog of the diglycidyl ether of bisphenol A (Epi-Rez 53 OC, Celanese Chemical), 25 grams of novolac epoxy (Den 438, Dow Chemical), 34 grams of 2 ethyl hexyl glycidyl ether (MK 116, Wilmington Chemical), 1.5 grams of cationic photo-initiator (UVE 1014, GE) 0.26 grams of a flow control agent (Modaflow, Monsanto), 0.16 grams of a surfactant (FC 430, 3M) and 0.1 grams of a blue pigment dispersion (Penn Color). This mix was screen printed through an imageless screen onto one side of the board and dried at 130° C. for 15 minutes to form a dry to the touch film over the board. This process was then repeated on the other side. This was then exposed, one side at a time, through a mask placed upon the film to ultra-violet radiation of the proper wavelength and intensity to activate the photo-initiator. After a ten minute at 130° C. post bake it was sprayed with methyl ethyl ketone and the sections protected from the radiation by the mask were washed away, while the sections exposed to the radiation through the mask stayed as a permanent insulating layer. The resultant photo-imaged dielectric had holes through it for both connections to the underlying conductors and to the through holes for component soldering. The conductive layers on either side were produced using GE product 111-298 (a metal filled epoxy ink used as a base for electroplating, U.S.

Pat. No. 4,470,883). This ink is screen printed in the desired pattern, cured, pre-cleaned in an acid bath and then electroplated in an acid copper electroplating bath.

Example 3

The following self-shielding multi-layer circuit board is produced having a conductive pattern on only one side of the base.

| uniform voltage conductive pattern, designed by print and etch technique, power supply, covers 90% of surface area of underlying circuit conductive pattern | 1/16" glass fiber epoxy base with plated through holes | circuit conductive pattern designed with print and etch technique | dielectric film, UV cured epoxy | uniform voltage conductive pattern designed by augmentative replacement technique, ground, covers 90% of surface area of underlying circuit conductive pattern |
|---|---|---|---|---|

1/16" + 4 mils

Example 4

The following self-shielding multi-layer circuit board is produced having two conductive patterns on a single side of the base.

| uniform voltage conductive pattern, designed by print and etch technique, power supply, covers 90% of surface area of underlying circuit conductive patterns | 1/16" glass fiber epoxy base with plated through holes | circuit conductive pattern designed with print and etch technique | dielectric film, UV cured epoxy | circuit conductive pattern designed by augmentative replacement techniques | dielectric film, UV cured epoxy | uniform voltage conductive pattern designed by augmentative replacement technique, ground, covers 90% of surface area of underlying circuit conductive patterns |
|---|---|---|---|---|---|---|

1/16" + 6 mils

Example 5

The following self-shielding multi-layer circuit board is produced having a circuit conductive pattern on only one side of the base.

| uniform voltage conductive pattern, solid foil no etch technique utilized, not part of circuit, covers 100% of surface area of underlying circuit conductive pattern | 1/16" glass fiber epoxy base, no through holes | circuit conductive pattern designed with print and etch technique | dielectric film, UV cured epoxy | uniform voltage conductive pattern designed by augmentative replacement technique, split voltage supplying ground and power, covers 90% of surface area of underlying circuit conductive pattern |
|---|---|---|---|---|

1/16" + 4 mils

Example 6

The following self-shielding multi-layer circuit board is produced having circuit conductive patterns on two sides of the base.

| uniform voltage conductive pattern designed by augmentative replacement technique, ground, covers 90% of surface area of underlying circuit conductive patterns | dielectric layer, UV cured epoxy | circuit conductive pattern designed by augmentative replacement technique | 1/16" glass fiber epoxy base with plated through holes | circuit conductive pattern designed by augmentative replacement technique | dielectric layer, UV cured epoxy | uniform voltage conductive pattern designed by augmentative replacement technique, power supply, covers 90% of surface area of underlying circuit conductive patterns |
|---|---|---|---|---|---|---|

1/16" + 6 mils

What is claimed is:
1. A multi-layer circuit board comprising
(a) a two-sided base;

(b) at least one combination of circuit conductive pattern with insulating dielectric layer adhered thereover designed on at least one side of said base; and (c) uniform voltage conductive patterns designed as an outermost conductive pattern on both sides of said two-sided base, wherein said uniform voltage conductive patterns cover a sufficient surface area of all underlying circuit conductive patterns to reduce the power of noise emission from said underlying circuit conductive patterns by $\frac{1}{2}$ in either direction from the surface of said two-sided base and at least one of said uniform voltage conductive patterns is designed by augmentative replacement techniques.

2. The circuit board of claim 1 wherein at least one said circuit conductive pattern is designed by resist imaging techniques.

3. The circuit board of claim 1 wherein at least one said circuit conductive pattern is designed by augmentative replacement.

4. The circuit board of claim 1 wherein said circuit conductive pattern and said dielectric layer thereover are applied to both sides of said two-sided base.

5. The circuit board of claim 1 wherein the thickness of said two-sided base is less than about $\frac{1}{4}$ inch.

6. The circuit board of claim 1 wherein said dielectric layers have a thickness ranging from about 1 to about 4 mils.

7. The circuit board of claim 1 wherein said uniform voltage conductive patterns cover at least about 50% of the surface area of all said underlying circuit conductive patterns from either side of said two-sided base.

8. The circuit board of claim 1 wherein said uniform conductive pattern is closer to the conductors of said circuit conductive pattern than said conductors are to one another.

9. The circuit board of claim 1 wherein said dielectric layer is photo-imaged.

10. The circuit board of claim 1 wherein said dielectric layer is screen printed.

11. A multi-layer circuit board comprising:
(a) a two-sided base;
(b) a combination of circuit conductive pattern with insulating dielectric layer adhered thereover designed on both sides of said base; and
(c) uniform voltage conductive patterns designed as an outermost conductive pattern on both sides of said base, wherein said uniform voltage conductive patterns cover at least about 50% of the surface area of all underlying circuit conductive patterns and both of said uniform voltage conductive patterns are designed by augmentative replacement techniques.

12. A multi-layer circuit board comprising:
(a) a uniform voltage conductive pattern designed by augmentative replacement on a dielectric layer covering a circuit conductive pattern as an outermost conductive pattern, wherein said uniform voltage conductive pattern covers a sufficient area of underlying circuit conductive patters to reduce the power of noise emission from said underlying circuit conductive patterns by $\frac{1}{2}$ in either direction from the surface of said two-sided base.

* * * * *